United States Patent
Bera et al.

(10) Patent No.: US 7,674,353 B2
(45) Date of Patent: *Mar. 9, 2010

(54) APPARATUS TO CONFINE PLASMA AND TO ENHANCE FLOW CONDUCTANCE

(75) Inventors: Kallol Bera, San Jose, CA (US); Daniel Hoffman, Saratoga, CA (US); Yan Ye, Saratoga, CA (US); Michael Kutney, Santa Clara, CA (US); Douglas A. Buchberger, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 614 days.

This patent is subject to a terminal disclaimer.

(21) Appl. No.: 11/531,479

(22) Filed: Sep. 13, 2006

(65) Prior Publication Data

US 2007/0023145 A1    Feb. 1, 2007

Related U.S. Application Data

(60) Provisional application No. 11/046,135, filed on Jan. 28, 2005, now abandoned.

(51) Int. Cl.
  *C23C 16/00* (2006.01)
  *C23F 1/00* (2006.01)
  *H01L 21/306* (2006.01)

(52) U.S. Cl. ............... 156/345.43; 156/345.51; 156/345.52; 156/345.53; 156/345.54; 156/345.55; 156/915; 118/723 E; 118/728; 118/729; 118/730

(58) Field of Classification Search ............ 156/345.51, 156/345.52, 345.53, 345.54, 345.55; 118/728, 118/729, 730
See application file for complete search history.

(56) References Cited

U.S. PATENT DOCUMENTS

| 5,413,673 | A | 5/1995 | Fujimoto |
| 5,534,751 | A | 7/1996 | Lenz et al. |
| 5,556,500 | A | 9/1996 | Hasegawa et al. |
| 5,639,334 | A | 6/1997 | Canale et al. |
| 5,919,332 | A | 7/1999 | Koshiishi et al. |

(Continued)

OTHER PUBLICATIONS

Office Action Dated Jun. 5, 2007, U.S. Appl. No. 11/046,135.

(Continued)

*Primary Examiner*—Parviz Hassanzadeh
*Assistant Examiner*—Rakesh Dhingra
(74) *Attorney, Agent, or Firm*—Patterson & Sheridan, LLP

(57) ABSTRACT

The embodiments of the present invention generally relate to a plasma reactor. In one embodiment, a plasma reactor includes a substrate support is disposed in a vacuum chamber body and coupled to bias power generator. An RF electrode is disposed above the substrate support and coupled to a very high frequency power generator. A conductive annular ring is disposed on the substrate support and has a lower outer wall, an upper outer wall and an inner wall. A step is extends upward and outward from a lower outer wall and inward and downward from the upper outer wall. The inner wall disposed opposite the upper and lower outer wall. In other embodiments, the annular ring may be fabricated from a conductive material, such as silicon carbide and aluminum.

20 Claims, 13 Drawing Sheets

U.S. PATENT DOCUMENTS

| | | |
|---|---|---|
| 6,257,168 B1 | 7/2001 | Ni et al. |
| 6,528,751 B1 | 3/2003 | Hoffman et al. |
| 6,706,138 B2 | 3/2004 | Barnes et al. |
| 6,716,762 B1 | 4/2004 | Lenz |
| 6,744,212 B2 | 6/2004 | Fischer et al. |
| 6,838,635 B2 | 1/2005 | Hoffman et al. |
| 6,853,141 B2 | 2/2005 | Hoffman et al. |
| 7,001,482 B2 * | 2/2006 | Landis et al. .......... 156/345.55 |
| 7,094,315 B2 | 8/2006 | Chen et al. |
| 2003/0013315 A1 | 1/2003 | Park et al. |
| 2004/0159287 A1 | 8/2004 | Hoffman et al. |
| 2005/0061447 A1 * | 3/2005 | Kim et al. .............. 156/345.51 |
| 2005/0103442 A1 | 5/2005 | Chen et al. |

OTHER PUBLICATIONS

U.S. Appl. No. 10/235,988, filed Sep. 4, 2002, Yang et al.
U.S. Appl. No. 10/418,996, filed Apr. 17, 2003, Bera et al.
U.S. Appl. No. 10/778,620, filed Feb. 3, 2004, Hoffman et al.
European Search Report dated May 26, 2006 for EP Application No. 06001700.1.
Prosecution history of, U.S. Appl. No. 11/046,135, as of May 11, 2009.
Prosecution history of, U.S. Appl. No. 11/381,399, as of May 11, 2009.

* cited by examiner

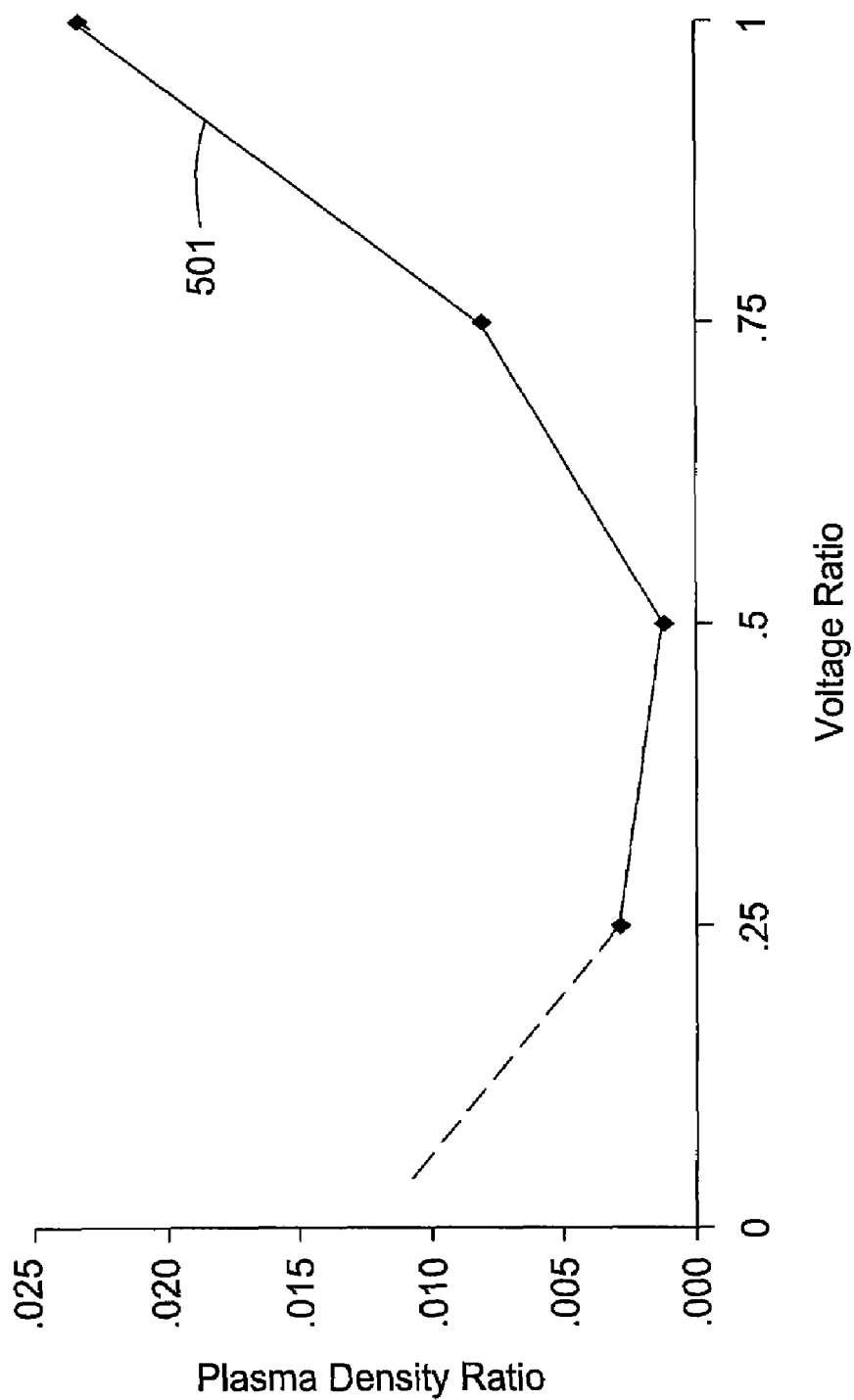

APPARATUS TO CONFINE PLASMA AND TO ENHANCE FLOW CONDUCTANCE

CROSS-REFERENCE TO RELATED APPLICATIONS

This application is a continuation of U.S. patent application Ser. No. 11/046,135, filed Jan. 28, 2005 now abandoned (APPM/9270), which is incorporated herein by reference.

FIELD OF THE INVENTION

The embodiments of the present invention generally relate to method and apparatus to confine plasma and to enhance flow conductance in plasma processing reactors.

BACKGROUND OF THE INVENTION

Plasma processing of semiconductor wafers in the manufacture of microelectronic integrated circuits is used in dielectric etching, metal etching, chemical vapor deposition and other processes. In semiconductor substrate processing, the trend towards increasingly smaller feature sizes and linewidths has placed a premium on the ability to mask, etch, and deposit material on a semiconductor substrate, with greater precision.

Typically, etching is accomplished by applying radio frequency (RF) power to a working gas supplied to a low pressure processing region over a substrate supported by a support member. The resulting electric field creates a reaction zone in the processing region that excites the working gas into a plasma. The support member is biased to attract ions within the plasma towards the substrate supported thereon. Ions migrate towards a boundary layer of the plasma adjacent to the substrate and accelerate upon leaving the boundary layer. The accelerated ions produce the energy required to remove, or etch, the material from the surface of the substrate. As the accelerated ions can etch other components within the processing chamber, it is important that the plasma be confined to the processing region above the substrate.

Unconfined plasmas cause etch-byproduct (typically polymer) deposition on the chamber walls and could also etch the chamber walls. Etch-byproduct deposition on the chamber walls could cause the process to drift. The etched materials from the chamber walls could contaminate the substrate by re-deposition and/or could create particles for the chamber. In addition, unconfined plasmas could also cause etch-byproduct deposition in the downstream areas. The accumulated etch-byproduct can flake off and result in particles. To reduce the particle issues caused by the deposition of etch-byproduct in the downstream areas, additional downstream clean is needed, which could reduce process throughput and increase processing cost.

Confined plasmas could reduce chamber contamination, chamber cleaning and improve process repeatability (or reduce process drift). Plasma confinement devices, such as slotted plasma confinement ring (described below), have been developed to confine plasma. Certain front end of line (FEOL) applications, such as contact etch and high aspect ratio trench etch, require relatively low process pressure (e.g. $\leq 30$ mTorr) under relatively high total gas flow rate (e.g. between about 900 sccm to about 1500 sccm). Plasma confinement devices, such as a slotted plasma confinement ring, could cause flow resistance for the gas flow to the downstream and results in pressure in the plasma chamber that is not low enough (e.g. $\leq 30$ mTorr) for the FEOL applications described.

Therefore, there is a need for an improved method and apparatus that not only confine plasma within a processing region inside the plasma chamber but also enhance flow conductance.

SUMMARY OF THE INVENTION

The embodiments of the present invention generally relate to a method and an apparatus to confine plasma and to enhance flow conductance in plasma processing reactors. In one embodiment, a plasma reactor is provided that includes a substrate support is disposed in a vacuum chamber body and coupled to bias power generator. An RF electrode is disposed above the substrate support and coupled to a very high frequency power generator. A conductive annular ring is disposed on the substrate support and has a lower outer wall, an upper outer wall and an inner wall. A step is extends upward and outward from a lower outer wall and inward and downward from the upper outer wall. The inner wall disposed opposite the upper and lower outer wall. In other embodiments, the annular ring may be fabricated from a conductive material, such as silicon carbide and aluminum.

In another embodiment, a plasma reactor includes an annular ring surrounding the top portion of the substrate support, wherein there is a gap between the annular ring and process chamber walls having a gap width from about 0.8 inch to about 1.5 inch, and a dielectric seal placed between a top electrode and a process chamber body, wherein impedances of the top electrode, the dielectric seal, the substrate along with the substrate support, and plasma reduce a voltage supplied to the top electrode by a voltage ratio and supply the remaining voltage supplied to the top electrode at a negative phase at the substrate and the substrate support during plasma processing.

In another embodiment, a plasma reactor includes an annular ring surrounding the top portion of a substrate support, wherein there is a gap between the annular ring and process chamber walls with gap width equaling to or greater than about 0.8 inch and not greater than 1.5 inch.

In another embodiment, a plasma reactor includes a substrate support having one or more dielectric layers, a dielectric seal surrounding a top electrode, wherein impedances of the top electrode, the dielectric seal, the substrate along with the substrate support, and plasma reduce a voltage supplied to the top electrode by a voltage ratio and supply the remaining voltage supplied to the top electrode at a negative phase at the substrate and the substrate support during plasma processing.

In another embodiment, a method of confining a plasma within a substrate processing region during substrate processing in a plasma processing chamber comprises placing a substrate on a substrate support in a plasma processing chamber with a top electrode, an annular ring surrounding the top portion of the substrate support with a gap between the annular ring and process chamber walls having a gap width from about 0.8 inch to about 1.5 inch, flowing process gas(es) into the plasma chamber, and creating a plasma in the plasma process chamber.

In another embodiment, a method of confining a plasma within a substrate processing region during substrate processing in a plasma processing chamber comprises placing a substrate on a substrate support in a plasma processing chamber having a top electrode, a dielectric seal surrounding the top electrode, an annular ring surrounding the top portion of the substrate support with a gap between the annular ring and process chamber walls having a gap width from about 0.8 inch to about 1.5 inch, flowing process gas(es) into the plasma chamber, and creating a plasma in the plasma process chamber by supplying a voltage ratio of the voltage supplied to the top electrode and supplying the remaining voltage supplied to the top electrode at a negative phase at the substrate and the substrate support.

In yet another embodiment, a method of confining a plasma within a substrate processing region during substrate processing in a plasma processing chamber comprises placing a substrate on a substrate support in a plasma processing chamber with a top electrode, and a dielectric seal surrounding the top electrode, flowing process gas(es) into the plasma chamber, and creating a plasma in the plasma process chamber by supplying a voltage at a voltage ratio of the voltage supplied to the top electrode and supplying the remaining voltage supplied to the top electrode at a negative phase at the substrate and the substrate support.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 5A shows the simulated plasma density ratio as a function of voltage ratio.

To facilitate understanding, identical reference numerals have been used, where possible, to designate identical elements that are common to the figures. The drawings in the figures are all schematic and not to scale.

DETAILED DESCRIPTION

Figure 1A:
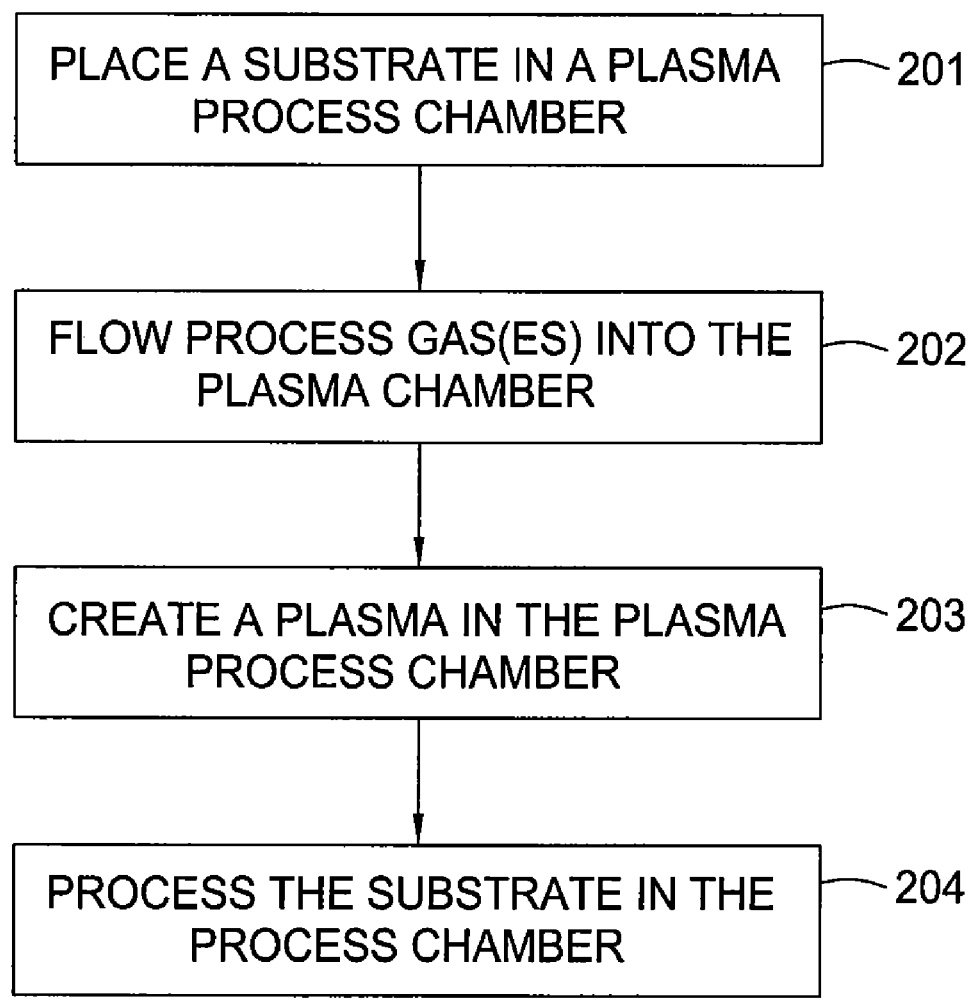
FIG. 1A shows the process flow of processing a substrate in a plasma chamber.

The process of processing a substrate in a plasma process chamber is shown in FIG. 1A. The process starts at step 201 by placing a substrate in a plasma process chamber. Next at step 202, process gas(es) is flown into the plasma process chamber. Then at step 203, a plasma is created in the plasma process chamber. At step 204, the substrate is processed in the plasma process chamber. The processing conducted in the plasma process chamber could be deposition, etching or plasma-treatment. The concept of the invention applies to any types of plasma processing.

Figure 1B:
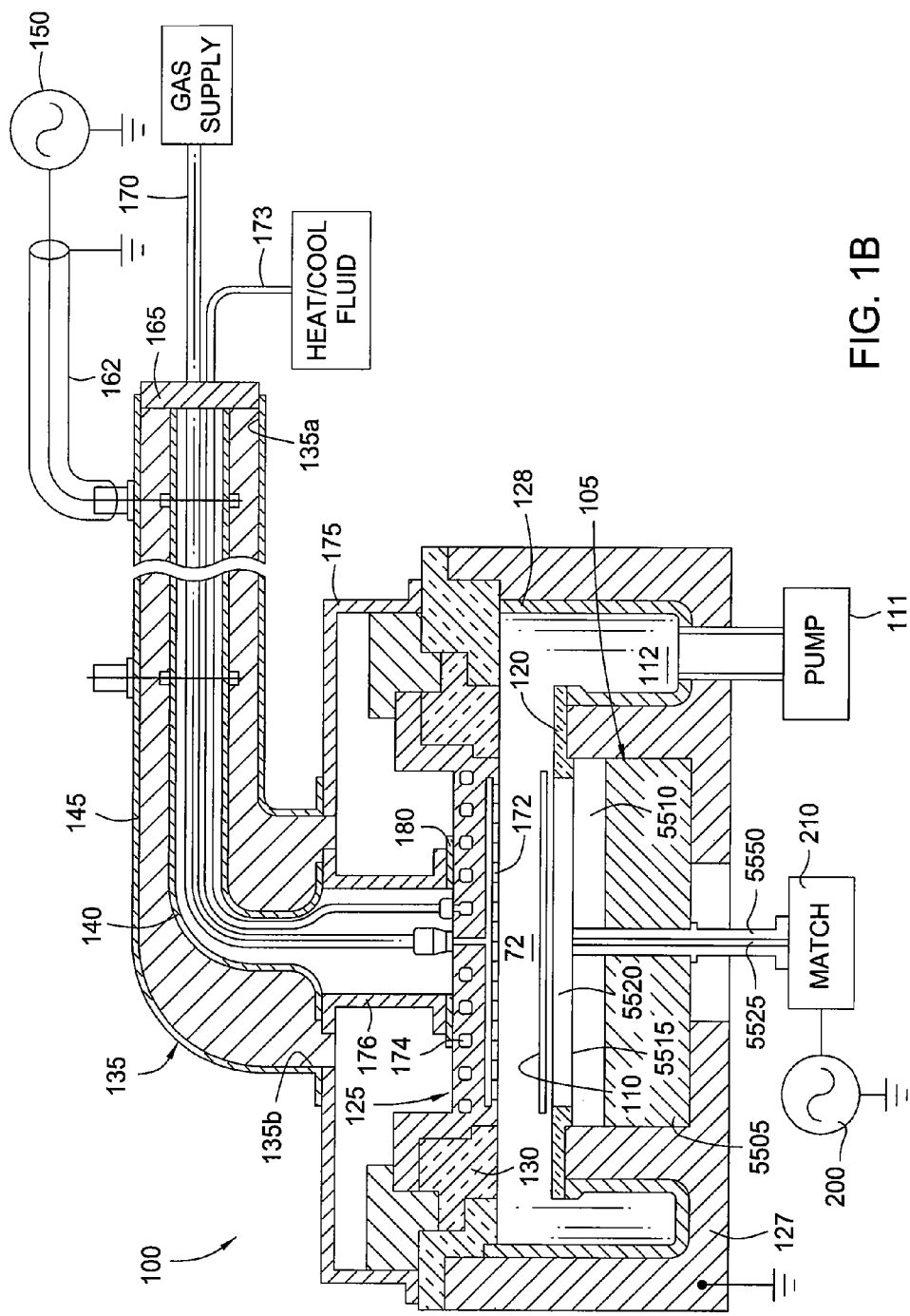
FIG. 1B shows a schematic drawing of a plasma processing chamber.

FIG. 1B illustrates an example of a plasma reactor, such as the Enabler® etch system manufactured by Applied Materials, Inc., of Santa Clara, Calif., that includes a reactor chamber 100, which may include liners to protect the walls, with a substrate support (or pedestal) 105 at the bottom of the chamber supporting a semiconductor wafer 110. The chamber 100 is bounded at the top by a disc shaped overhead aluminum electrode 125 supported at a predetermined gap length above the wafer 110 on grounded chamber body 127 by a dielectric (quartz) seal 130. A power generator 150 applies very high frequency (VHF) power to the electrode 125. VHF is typically between about 30 MHz to about 300 MHz and is one of the RF bands, which range from about 10 kHz to about 10 GHz. In one embodiment, the VHF source power frequency is 162 MHz for a 300 mm wafer diameter. VHF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and coaxial cable 162 or the VHF power generator 150. The chamber body is connected to the VHF return (VHF ground) of the VHF generator 150. Bias power is applied to the wafer by a bias power RF signal generator 200 coupled through a conventional impedance match circuit 210 to the wafer support 105. The power level of the bias generator 200 controls the ion energy near the wafer surface. The bias power (typically at 13.56 MHz) is typically used to control ion energy, while the VHF source power is applied to the overhead electrode to govern plasma density. A vacuum pump system 111 evacuates the chamber 100 through a plenum 112.

The substrate support 105 includes a metal pedestal layer 5505 supporting a lower insulation layer 5510, an electrically conductive mesh layer 5515 overlying the lower insulation layer 5510 and a thin top insulation layer 5520 covering the conductive mesh layer 5515. The semiconductor workpiece or wafer 110 is placed on top of the top insulation layer 5520. The substrate support 105 and the wafer 110 form a cathode during substrate processing. If the wafer 110 is not present, the substrate support 105 is the cathode during plasma processing. The electrically conductive mesh layer 5515 and the metal pedestal layer 5505 may be formed of materials such as molybdenum and aluminum respectively. The insulation layers 5510 and 5520 may be formed of materials such as aluminum nitride or alumina. The conductive mesh layer 5515 supplies the RF bias voltage to control ion bombardment energy at the surface of the wafer 110. The conductive mesh 5515 also can be used for electrostatically chucking and de-chucking the wafer 110, and in such a case can be connected to a chucking voltage source in the well-known fashion. The conductive mesh 5515 therefore is not necessarily grounded and can have, alternately, a floating electric potential or a fixed D.C. potential in accordance with conventional chucking and de-chucking operations. The wafer support 105, in particular the metal pedestal layer 5505, typically (but not necessarily) is connected to ground, and forms part of a return path for VHF power radiated by the overhead electrode 125.

In order to improve the uniformity of impedance across the substrate support, a dielectric cylindrical sleeve 5550 is designed to surround the RF conductor 5525. The axial length and the dielectric constant of the material constituting the sleeve 5550 determine the feed point impedance presented by the RF conductor 5525 to the VHF power. By adjusting the axial length and the dielectric constant of the material constituting the sleeve 5550, a more uniform radial distribution of impedance can be attained, for more uniform capacitive coupling of VHF source power.

A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 can provide a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 while the metallic coolant line 173 feeds coolant passages or jackets 174 within the overhead electrode 125.

As described earlier, unconfined plasmas cause etch-byproduct (typically polymer) deposition on the chamber walls and could also etch the chamber walls. Etch-byproduct deposition on the chamber walls could cause the process to drift. The etched materials from the chamber walls could contaminate the substrate by re-deposition and/or could create particles for the chamber. In addition, unconfined plasmas could also reach the downstream areas of the processing zone and cause etch-byproduct, which is typically polymer, deposition in the downstream areas. The etch-byproduct deposited in the downstream areas is difficult to clean. The accumulated etch-byproduct can flake off and result in particles. To reduce the particle issues and cleaning time, a slotted confinement ring 50 (see FIG. 2 prior art) placed around the wafer 110 and between the overhead electrode 125 and substrate support 105 had been previously proposed.

Figure 2:
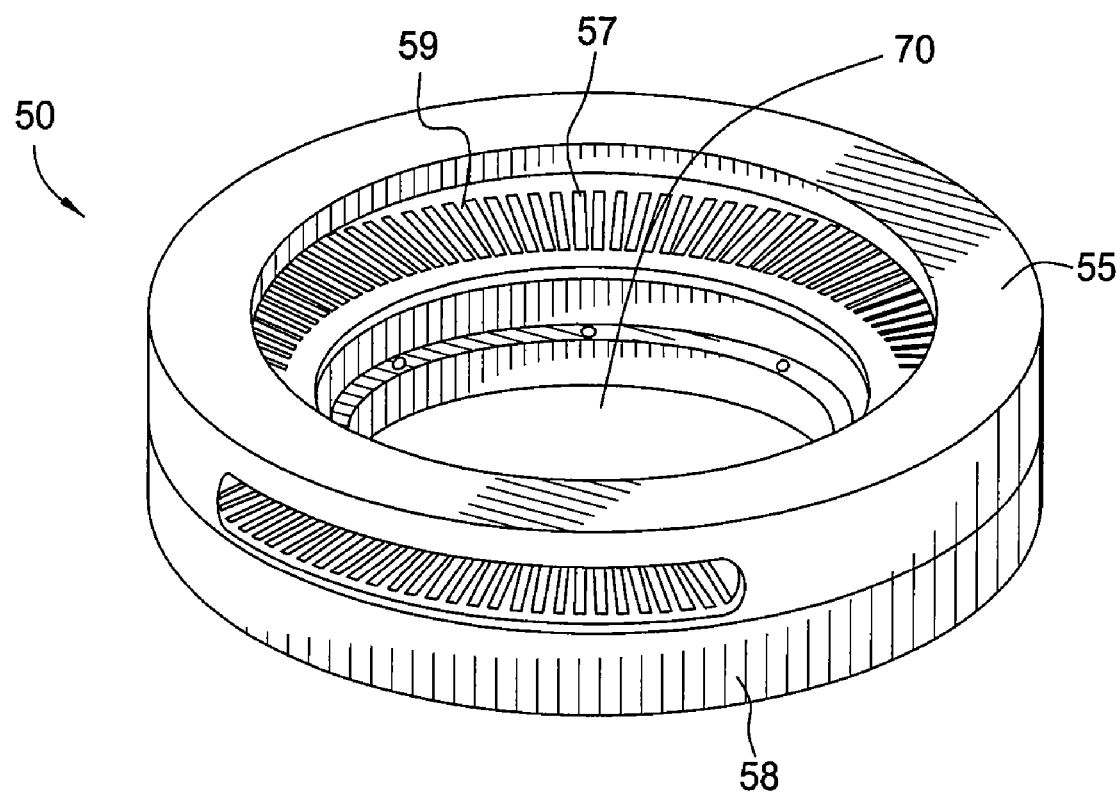
FIG. 2 (Prior Art) shows a schematic drawing of a slotted plasma confinement ring.

FIG. 2 (prior art) illustrates a perspective view of a slotted confinement ring 50 that has been previously proposed to confine plasma. The details of the slotted confinement ring 50 are further described in commonly assigned U.S. patent application Ser. No. 10/418,996, entitled "Apparatus And Method To Confine Plasma And Reduce Flow Resistance In A Plasma Reactor, filed Apr. 17, 2003, which is incorporated herein by reference. The slots in the confinement ring 50 allow the process gas mixture to pass through and reduce the flow resistance across the chamber 100. The confinement ring 50 includes a baffle 55 and a base 58 coupled to a bottom portion of the baffle 55. The base 58 is generally configured to provide electrical grounding and mechanical strength for the confinement ring 50. The baffle 55 defines an opening 70 at its top portion. The opening 70 is configured to receive the showerhead of the gas distribution plate 125 so that gases flowing the showerhead will be confined within the processing region 72 inside the baffle 55. The baffle 55 further includes a plurality of slots 57 and a plurality of fingers 59, disposed around the wafer 110. Neutrals in the plasma are configured to pass through the slots 57 into the plenum 112.

Although the slotted confinement ring 50 provides good plasma confinement and the slots 57 in the confinement ring 50 reduce flow resistance across the chamber 100 low enough for most applications, for some FEOL applications, the flow resistance is too high. As described earlier, for front end of line (FEOL) applications, such as contact etch and high aspect ratio trench etch, require relatively low process pressure (e.g. $\leqq 30$ mTorr) and high total gas flow rate (e.g. between about 900 sccm to about 1500 sccm). The flow resistance created by the slotted confinement ring could make the chamber pressure rise above the required low pressure range for these applications. Therefore, there is a need to design a confinement ring that not only confines plasma but also further reduces flow resistance.

Since plasma density is relatively low near the wall, an annular ring placed around the substrate 110 with a distance (or gap) from the inner chamber wall 128 could possibly have the same level of plasma confinement as the slotted confinement ring design, and yet decrease the flow resistance. The distance (or gap) between the edge of the annular ring and the inner chamber wall 128 can not be too large. If the gap distance is larger than the plasma sheath thickness near the chamber wall, it could increase the amount of plasma being drawn away from the reaction zone above the wafer and toward the chamber wall and downstream, which makes the plasma less confined. The distance (or gap) between the edge of the annular ring and the inner chamber wall 128 cannot be too small either, since the flow resistance, which affects the chamber pressure, would increase to an unacceptable level. Therefore, an annular plasma confinement ring, placed around the substrate 110 with a suitable distance from the inner chamber wall 128, is proposed to meet the requirement of good plasma confinement and low flow resistance.

Figure 3A:
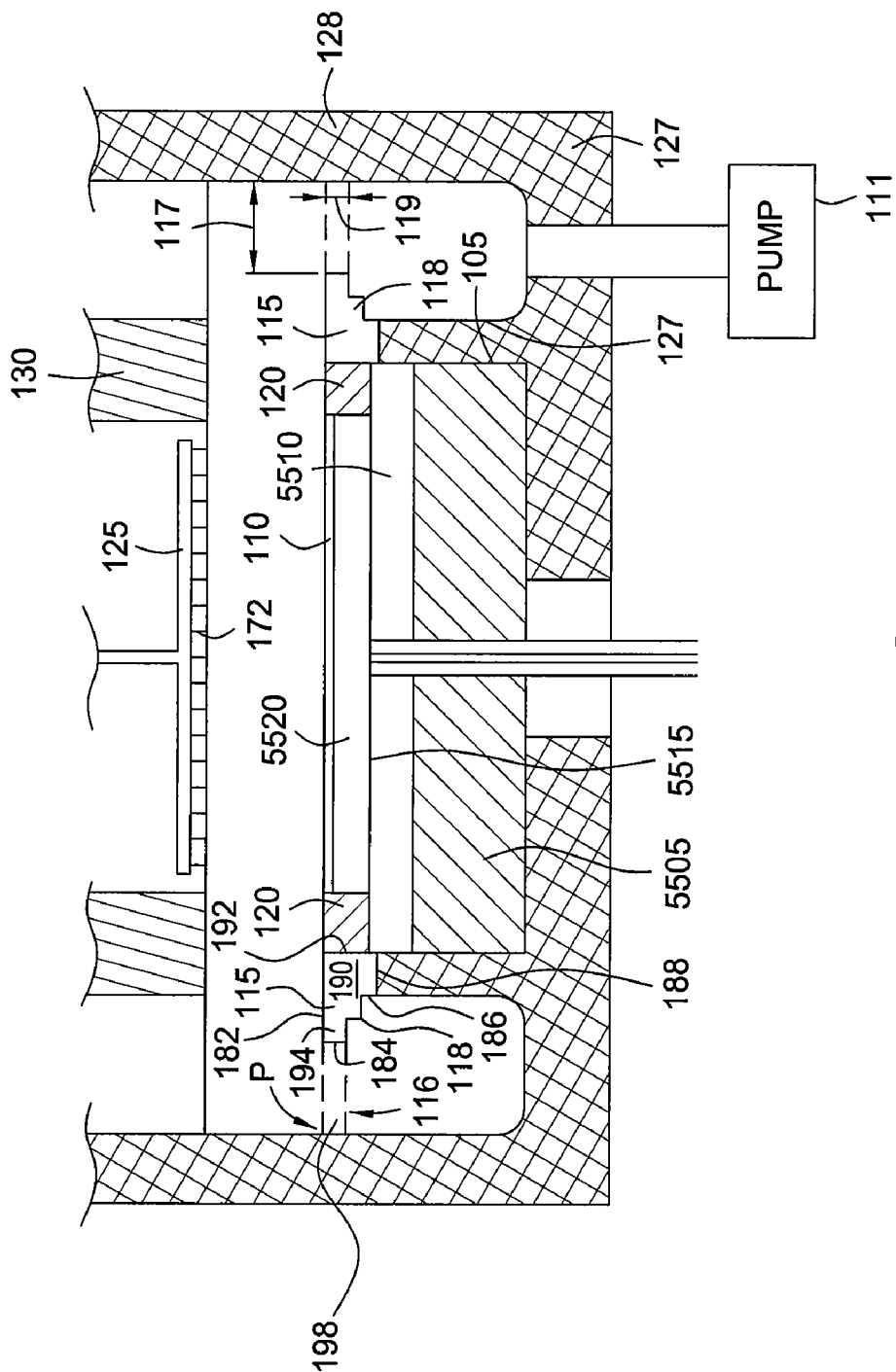
FIG. 3A shows a schematic drawing of a plasma processing chamber with one embodiment of an annular plasma confinement ring in the process chamber.

FIG. 3A shows a schematic drawing of an embodiment of the processing chamber with an annular plasma confinement ring 115. The annular ring 115 may be fabricated by conductive materials, such as silicon carbide (SiC) or aluminum (Al). The annular ring 115 surrounds the wafer 110. The annular ring 115 is coupled to the grounded chamber body 127 and is electrically separated from the substrate support 105 by a dielectric (quartz) ring 120, which is needed to prevent the conductive annular ring 115 from touching the substrate 110 and conductive mesh layer 5515 to prevent eliminating the effect of bias power. The lowest point of the dielectric ring 120 should be below the lowest point of the conductive mesh layer 5515. The top surface of the annular ring 115 should be at about the same surface plane as the substrate 110 to allow substrate 110 to be placed properly on the substrate support 105 and to minimize flow re-circulation. The top surface of the dielectric ring 120 could be at the same height as the top surface of substrate 110 and the top surface of the annular ring 115, as shown in the embodiment in FIG. 3A. The top surface of the dielectric ring 120 could also be slightly lower than the top surface of substrate 110 and the top surface of the annular ring 115, as shown in another embodiment in FIG. 3B. In the embodiment shown in FIG. 3B, the plasma confinement annular ring 115 is place on top of the dielectric ring 120.

In one embodiment, the annular ring 115 includes a body 190. The body 190 generally includes a top surface 182, an upper outer wall 184, a lower outer wall 186, a bottom surface 188 and an inner wall 192. The top and bottom surface 182, 188 define the uppermost and lowermost surfaces of the body 190. The inner and upper outer wall 192, 184 respectively define the innermost and outermost diameters of the body 190. In one embodiment, the inner wall 192 defines an inner diameter of the annular ring 115 between about 12.5 inch and about 15 inch, such as about 13.7 inch. The upper outer wall 184 defines an outer diameter of the annular ring 115 between about 15.5 inch and about 20.5 inch, such as about 19.85 inch. Alternatively, the inner diameter of the annular ring 115 may be varied in accordance with the substrate diameter. The inner wall 192 contacts a sidewall of the dielectric ring 120 so that the annular ring 115 is prevented from direct contact the substrate 110.

The bottom surface 188 is configured to support the annular ring 115 on the grounded chamber body 127 isolated from the substrate support 105. The bottom surface 188 is generally perpendicular to a centerline of the annular ring 115 to maintain perpendicularity with the grounded chamber body 127 and parallelism with the substrate 110. The bottom surface 188 has a planar and horizontal surface providing a mating surface to contact with the grounded chamber body 127 supporting the annular ring 115. In one embodiment, the bottom surface 188 of the annular ring 115 may be bolted, adhered, magnetically attracted, screwed, welded, clamped, fastened, or secured by other suitable methods to the grounded chamber body 127.

A step 118 is formed between the upper outer wall 184 and lower outer wall 186 to enhance the mechanical strength of the annular ring 115. The step 118 is formed upward and outward from the lower outer wall 186 and inward and downward from the upper outer wall 184. In one embodiment, the step 118 may have different configuration, such as rectangular periphery or round periphery, size, width and length.

The upper outer wall 184 defines the outermost diameter of the body 190 and is configured to be spaced a distance away from the inner chamber wall 128 so as to define a gap 198 between the inner chamber wall 128 and the annular ring 115. The upper outer wall 184 and an upper portion the inner wall 192 define a top section 194 between the outermost and innermost diameters of the body 190. The top section 194 of the body 190 has a thickness 119 selected to control the flow resistance of gases passing through the gap 198 in the chamber 100.

The annular ring 115 is away from the inner chamber wall 128 at a gap width 117. The thickness 119 of the top section 194 of the annular ring 115 should not be too thick, since the flow resistance would increase with increasing thickness 119. In one embodiment, the thickness 119 is in the range between about ⅛ inch to about ¼ inch. The corner 118 of the annular ring is used to provide the annular ring mechanical strength, since the top section 194 with thickness 119 is limited in its thickness and mechanical strength. Structures other than the corner 118 that can provide mechanical strength can also be used.

In order to better understand the impact of the gap width 117 to the effectiveness of plasma confinement and the chamber pressure, chamber plasma density and pressure simulations have been conducted for the annular ring design and the slotted ring design for comparison. For chamber pressure simulation, computation fluid dynamics (CFD) software CFD-ACE+ by ESI group of France is used. CFD-ACE+ is a general, partial differential equation (PDE) solver for a broad range of physics disciplines including: flow, heat transfer, stress/deformation, chemical kinetics, electrochemistry, and others. It solves them in multidimensional (0D to 3D), steady and transient form. CFD-ACE+ is used for complex multiphysics and multidisciplinary applications. For the current study, the "Flow" module of the software is used. Pressure simulation by using the "Flow" module of CFD-ACE+ simulator matches experimental results quite well. Table 1 shows comparison of simulation and experimental results for a reactor described in FIG. 1B with a slotted plasma confinement ring described in FIG. 2. In Table 1, the pump pressure refers to the pressure set value for pump 111 of FIG. 1B. The chamber inner radius is 27 cm and the distance between the wafer 110 and the lower surface of the top electrode 125 is 3.2 cm. The chamber pressure data are collected at 6.8 cm away from the wafer center and right above the wafer. The below-ring pressure data are collected right beneath the slotted confinement ring. The results show a good match between the simulated and experimental results. The results also show that the slotted confinement ring has relatively high flow resistance and increases the pressure inside the reaction chamber significantly above the pressure set value.

TABLE 1

Experimental and simulated chamber pressure and below-ring pressure comparison.

| Gas Flow (sccm) | "Set" Pump Pressure (mTorr) | Measured Chamber Pressure (mTorr) | Simulated Chamber Pressure (mTorr) | Measured Below-Ring Pressure (mTorr) | Simulated Below-Ring Pressure (mTorr) |
|---|---|---|---|---|---|
| 2000 | 40 | 55.6 | 58.8 | 40.2 | 43.5 |
| 900 | 10 | 21.5 | 25.0 | 11.6 | 14.5 |
| 900 | 40 | 46.5 | 49.3 | 40.2 | 41.6 |

The chamber plasma density simulation uses the hybrid plasma equipment model (HPEM), developed by the Department of Electrical and Computer Engineering of University of Illinois at Urbana-Champaign, Urbana, Ill. The HPEM is a comprehensive modeling platform for low pressure (less than 10 Torr) plasma processing reactors. Details about plasma density simulation by this simulator can be found in an article, titled "Argon Metastable Densities In Radio Frequency Ar, Ar/$O_2$ and Ar/$CF_4$ Electrical Discharges", published in pages 2805-2813 of Journal of Applied Physics, volume 82 (6), 1997. The plasma simulator is widely used in the semiconductor equipment industry. Our experience shows that plasma simulation of process parameter variation by HPEM matches the process results quite well.

For the annular ring design, the simulation includes gap width 117 from 0.5 inch to 3 inch. The process condition simulated resembles the contact etch and deep trench etch mentioned previously. High gas flow rate of 1500 sccm is used to simulate high gas flow rate. The process gas only includes $O_2$, instead of including other types of process gases, such as $C_4F_6$ and argon (Ar), to simplify the simulation. For plasma confinement study that compares degree of plasma confinement as a function of the gap width 117, using only $O_2$ gas in simulation could provide learning of the impact of the gas distance 117 on plasma confinement. The top electrode power (or source power) simulated is 1.85 KW and the gas temperature is 80° C. The total source power is 1.85 kW. The top electrode voltage (or source voltage), $V_s$, is typically between about 100 to about 200 volts. 175 volts of $V_s$ has been used in the simulation. The radius of the substrate (or wafer) is 15 cm (or 6 inch) and the spacing between the top electrode to the substrate is 3.2 cm (or 1.25 inch). The radius of inner chamber wall 128 is 27 cm (or 10.6 inch). The width of the dielectric ring 120 is 2.2 cm (or 0.87 inch) and the width of the annular plasma confinement ring 115 simulated varies between 8.5 cm (or 3.3 inch) to 2.2 cm (or 0.9 inch). The spacing between the annular confinement ring 115 with the inner chamber wall 128 simulated varies between 1.3 cm (or 0.5 inch) to 7.6 cm (or 3.0 inch).

Figure 3B:
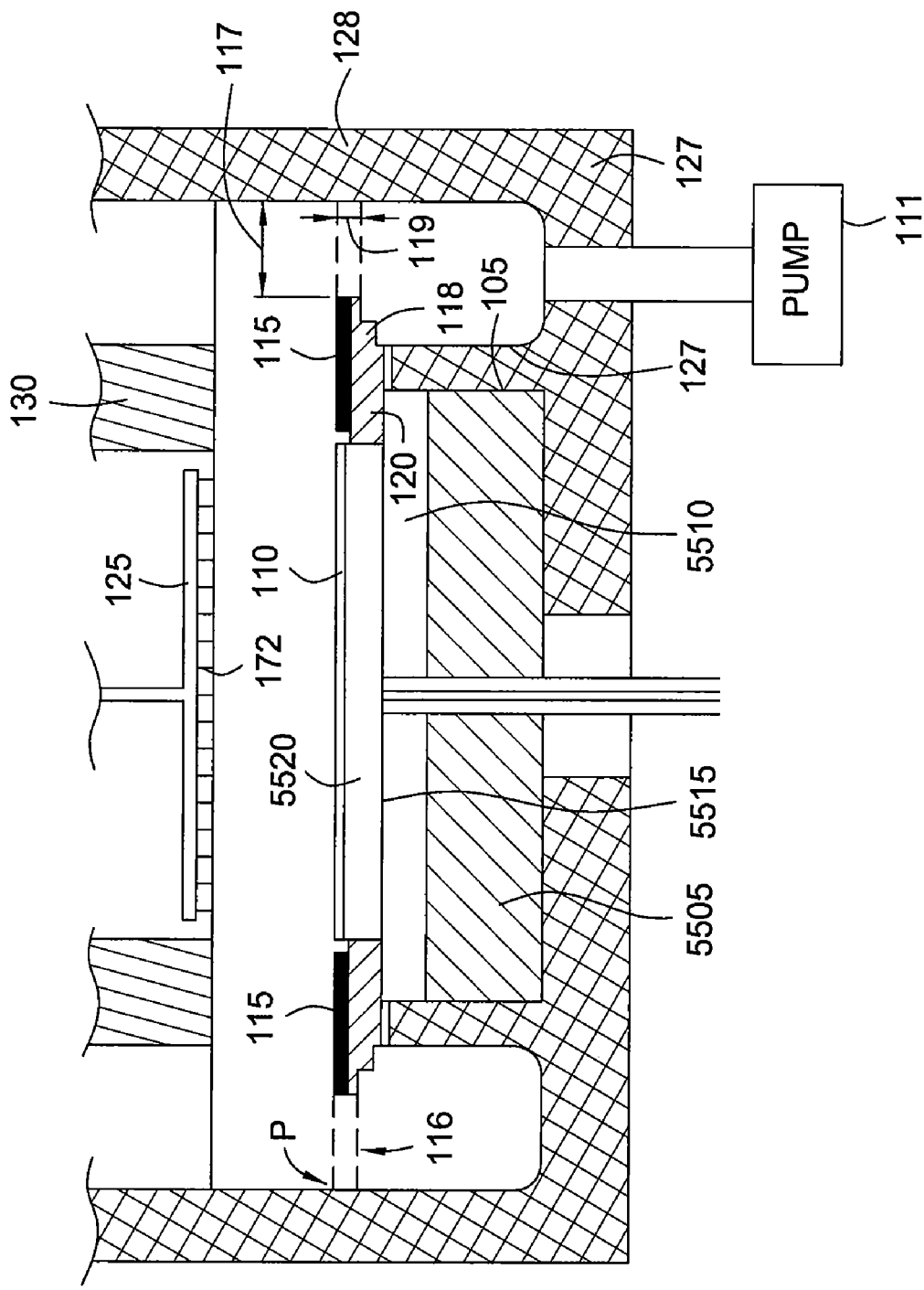
FIG. 3B shows a schematic drawing of a plasma processing chamber with another embodiment of an annular plasma confinement ring in the process chamber.
Figure 3C:
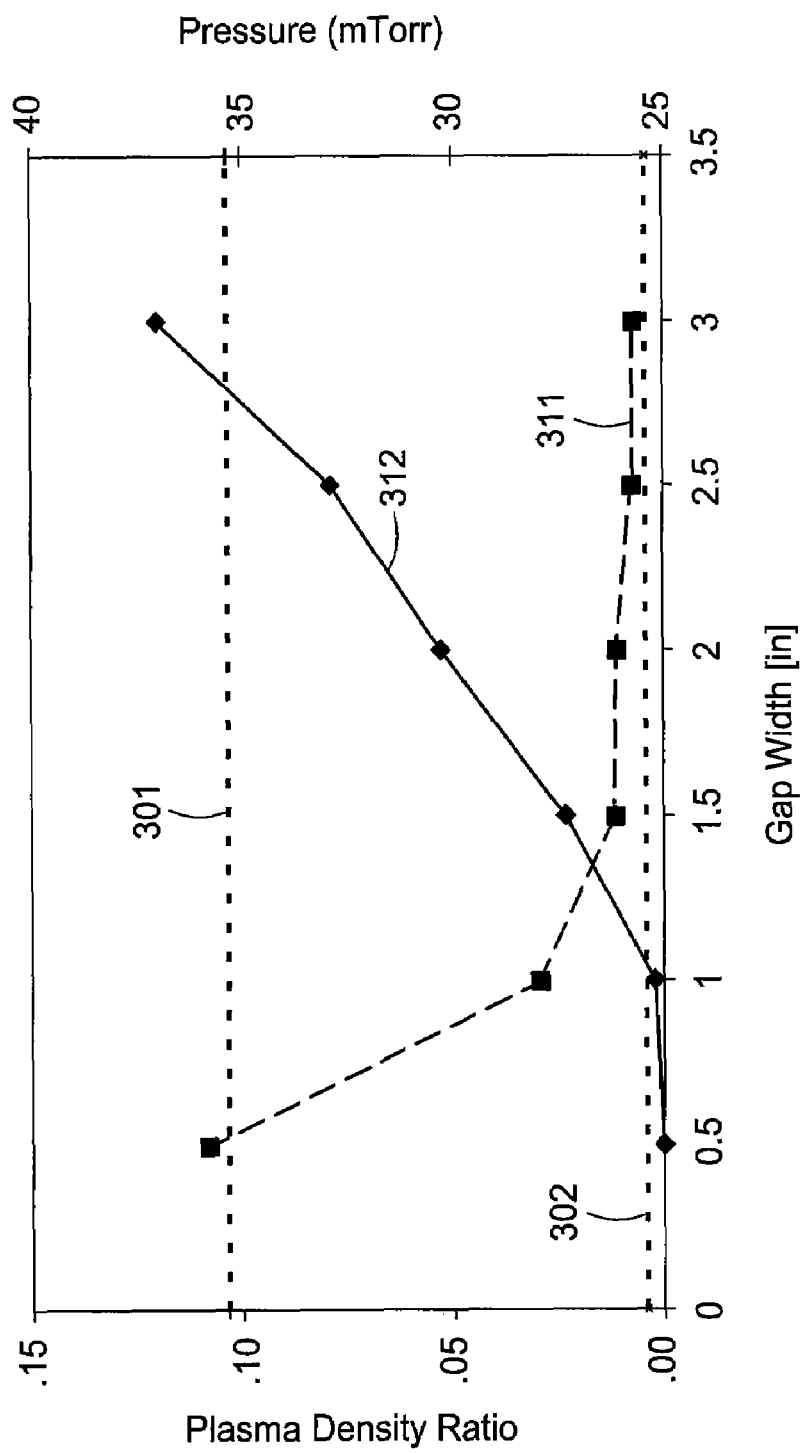
FIG. 3C shows the simulated results of plasma density ratio and chamber pressure as a function of the gap width.

FIG. 3C shows plasma simulation results for the plasma chamber described in FIG. 1 with an annular ring 115 described in FIG. 3A. In a low pressure plasma chamber, pressure and plasma density are not completely uniform across the entire chamber. The pressure is typically higher near the center of the wafer, lower near the wafer edge, and reaches the pump pressure set point at the pump. The pressure data in FIG. 3B are pressure at intersection of the chamber wall and the wafer top surface plane, or location "P" in FIG. 3A. In order to quantify the degree of confinement level, a plasma density ratio is defined as the ratio of maximum plasma density below line 116, which is extended along right below the top section 194 of the annular ring 115, to the maximum plasma density in the process chamber, which occurs in the volume between the wafer surface and the overhead aluminum electrode 125. The lower the plasma density ratio, the better the plasma confinement ring has performed in confining plasma.

The dashed line 301 in FIG. 3C shows the 35.3 mTorr chamber pressure for the slotted confinement ring design. Dashed line 302 in FIG. 3C shows the 0.004 plasma density ratio obtained for the slotted confinement ring design. The 35.3 mTorr chamber pressure and 0.004 plasma density ratio are both obtained from simulation results. Since slotted ring design does not vary the gap width 117, they dashed lines 301 and 302 are horizontal lines. Curve 311 shows chamber pressure as a function of gap width 117, while curve 312 shows plasma density ratio as a function of gap width 117. For annular ring design at 0.5 inch gap width, the chamber pressure is found to be 35.8 mTorr, which is higher than the slotted confinement ring design, and the plasma density ratio is 0.00013, which is lower than the slotted confinement ring design. Although the lower plasma density ratio is desirable, the higher chamber pressure is not. When the gap width 117 is increased to 1 inch, the chamber pressure reduces to 27.9 mTorr, which is lower than the slotted ring design and lower than the low pressure requirement of <30 mTorr for front end process, and the plasma density ratio is 0.002, which is still lower than the slotted ring design. When the gap width 117 is increased to 1.5 inch, the chamber pressure further reduces to 26.2 mTorr, and the plasma density ratio is 0.023, which is higher than the slotted ring design but is still relatively low. As the gap width 117 increases beyond 1.5 inch, the effect of the wider gap width 117 in lowering the chamber pressure is reduced; however, the plasma density ratio continues to increase.

Table 2 shows comparison of simulation results for a reactor described in FIG. 1B with a slotted plasma confinement ring described in FIG. 2 and an annular plasma confinement ring described in FIG. 3A. The gap distance between the annular ring to the chamber walls 128 is 1 inch. In Table 2, the pump pressure refers to the pressure set value for pump 111 of FIG. 1B. The chamber inner radius is 27 cm and the distance between the wafer 110 and the lower surface of the top electrode 125 is 3.2 cm. The chamber pressure data are collected at 6.8 cm away from the wafer center and right above the wafer. The below-ring pressure data are collected right beneath the slotted confinement ring or the annular ring. The results show that the chamber pressure is higher for the slotted plasma confinement ring than the annular plasma confinement ring. In addition, the pressure difference between the chamber and below the confinement ring is higher for the slotted ring ($\Delta P=15.3$ mTorr) than the annular ring ($\Delta P=9.4$ mTorr).

TABLE 2

Comparison of simulated chamber pressure and below-ring pressure for slotted confinement ring and annular ring with 1 inch gap distance from the chamber walls.

| Gas Flow (sccm) | "Set" Pump Pressure (mTorr) | Chamber Pressure (mTorr) Slotted Ring | Chamber Pressure (mTorr) Annular Ring | Below-Ring Pressure (mTorr) Slotted Ring | Below-Ring Pressure (mTorr) Annular Ring |
|---|---|---|---|---|---|
| 2000 | 40 | 58.8 | 54.1 | 43.5 | 44.7 |

Figure 3D:
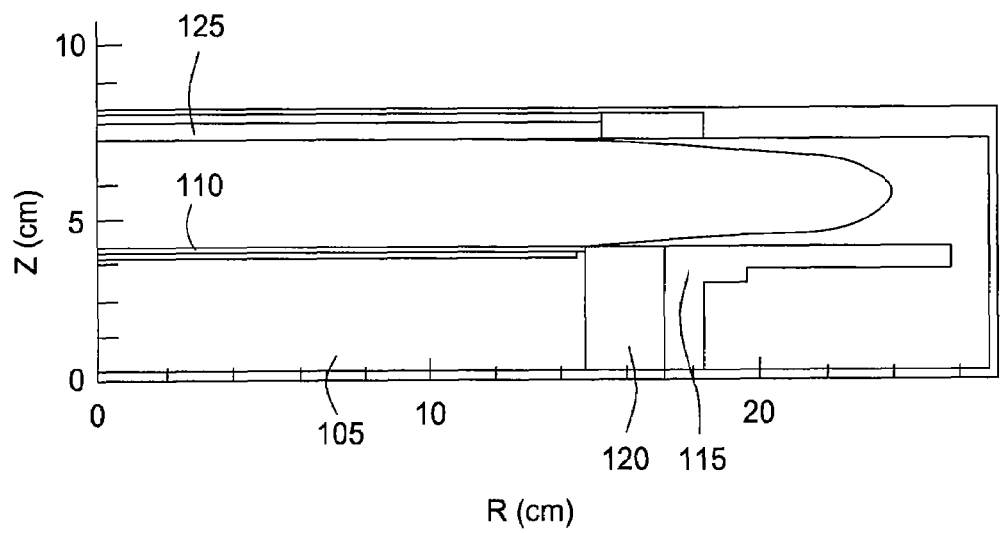
FIG. 3D shows the simulated result of plasma density in the plasma processing chamber when the gap width between the annular ring and the chamber walls is 0.5 inch.
Figure 3E:
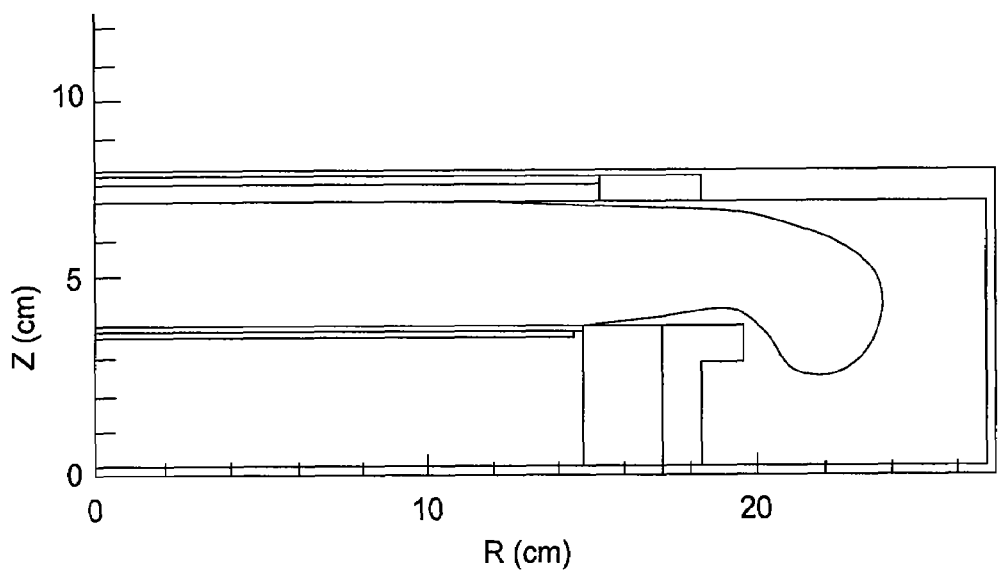
FIG. 3E shows the simulated result of plasma density in the plasma processing chamber when the gap width between the annular ring and the chamber walls is 3 inches.

FIG. 3D shows the simulation result of plasma density in the process chamber when the gap width 117 is 0.5 inch, wherein the plasma density ratio is 0.00013. The X-axis is the distance from the center of the process chamber and the Y-axis the distance from 3.9 cm below the top surface of the substrate support 105. The results show that the plasma is relatively confined within the region above the substrate. Unfortunately, the chamber pressure is 35.8 mTorr, which is higher than the specification of $\leqq 30$ mTorr. FIG. 3E shows the simulation result of plasma density in the process chamber when the gap width 117 is 3 inch, wherein the plasma density ratio is 0.12. The results show that there is a significant plasma loss to the reactor downstream.

The simulation results in FIG. 3C show that as the gap width 117 increases, the resistance to the flow decreases, hence the wafer pressure decreases. While, with increase in gap width 117, more plasma penetrates downstream the confinement ring, hence, the plasma density ratio increases. In order to keep the chamber pressure $\leqq 30$ mTorr, the gap width 117 should be equal to or greater than about 0.8 inch, according to simulation results in FIG. 3B. However, the gap width 117 cannot be too large, since large gap width 117 results in higher plasma loss to the downstream. As described earlier, as the gap width 117 increases beyond 1.5 inch, the effect of the wider gap width 117 in lowering the chamber pressure is not significant; however, the plasma density ratio continues to increase. The plasma density ratio at gap width 117 of 1.5 inch is 0.023, which is reasonably low. Therefore, the gap width 117 should be kept below 1.5 inch.

To further improve the plasma confinement, the concept of lowering the top electrode voltage to reduce voltage drop between the top electrode 125 and chamber walls 128 has been investigated. Typically, the source power is mainly supplied through the top electrode at a source voltage, $V_s$. If the top electrode voltage is lower to a fraction, f, of the source voltage at $fV_s$ and the cathode, which is formed by the substrate support 105 and the wafer 110 during substrate processing, maintains a voltage of $-(1-f)V_s$, the voltage difference between the top electrode 125 and the cathode, which is formed by the substrate support 105 and the wafer 110 during substrate processing, is kept at the same voltage value, $V_s$, but the voltage difference between the top electrode 125 and the grounded chamber walls 128 will be lowered to $fV_s$. Lower voltage difference between the top electrode 125 and the ground chamber walls 128 would reduce the amount of plasma being drawn to the chamber walls 128. The way to supply the source power at a lower top electrode voltage, $fV_s$, and to maintain the cathode at a negative phase from the top electrode at $-(1-f)V_s$ is by adjusting the impedance of chamber components associated with the top electrode 125, the cathode, which is formed by the substrate support 105 and the wafer 110 during substrate processing, and chamber walls 128. When the wafer 110 is not present in the chamber during processing, the substrate support 105 forms the cathode. Details of how to adjust the impedance of the chamber components to lower the top electrode voltage will be described below.

Figure 4A:
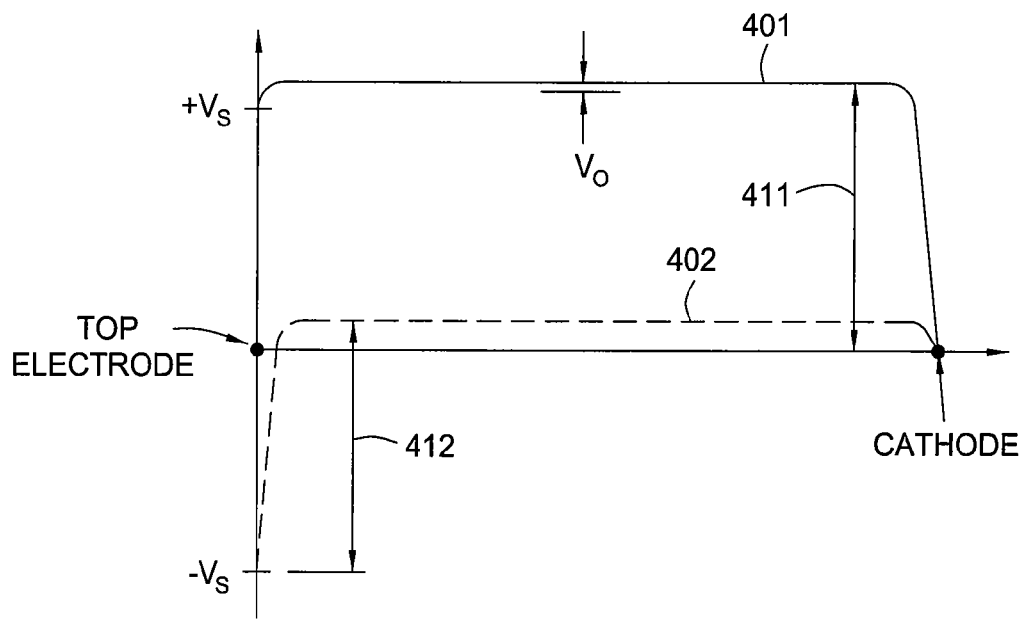
FIG. 4A shows the voltage between the top electrode and the grounded cathode when the voltage ratio is 1 (or source voltage fully supplied at top electrode).
Figure 4B:
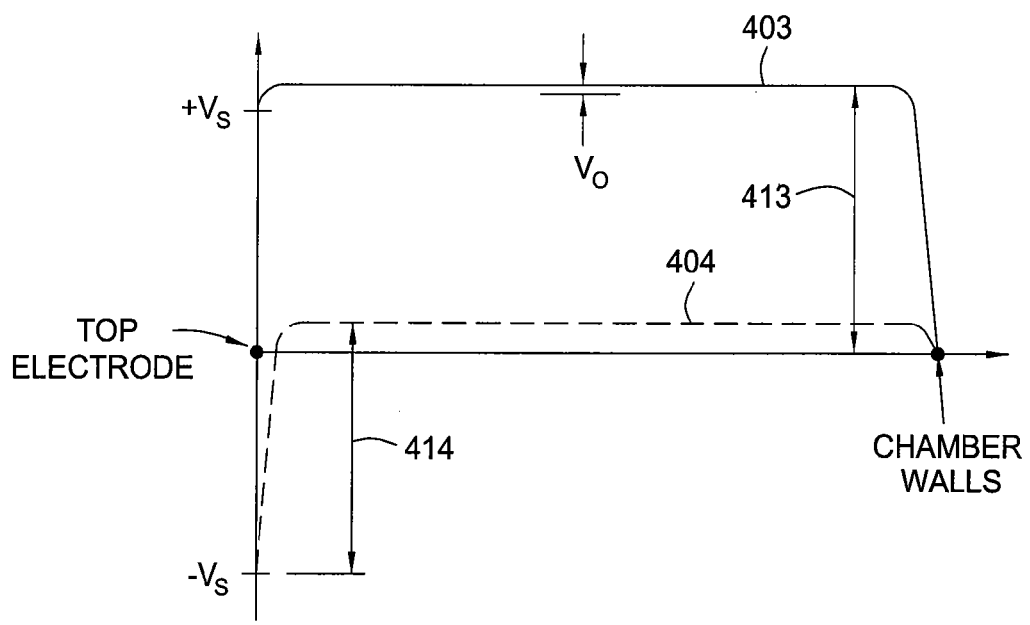
FIG. 4B shows the voltage between the top electrode and the grounded chamber wall when the voltage ratio is 1 (or source voltage fully supplied at top electrode).

FIG. 4A shows the relative voltage values of top electrode 125 (or source) and cathode (substrate support 105 along with the wafer 110 during substrate processing), which is grounded. FIG. 4B shows the relative voltage values of top electrode 125 and chamber walls 128, which is grounded. The X axes in both figures represent the spaces between the top electrode 125 and the cathode, which is formed by the substrate support 105 and the substrate 110, or inner surfaces chamber walls 128. The distances of X-axes are not to scale. The top electrode voltage oscillates between $+V_s$ and $-V_s$, while cathode and chamber walls stay at 0 (ground). The bulk of the plasma has a voltage that is higher than the top electrode by $V_o$, which is much smaller than $V_s$. Curve 401 represents the voltage between the top electrode 125 and cathode, which is formed by the substrate support 105 and the wafer 110 during substrate processing, when the top electrode voltage is at $+V_s$. The voltage difference 411 between the top electrode 125 and the cathode when the top electrode voltage is at $+V_s$ equals to $V_s$. Dashed curve 402 represents the voltage between the source and the cathode when the source voltage is at $-V_s$. The voltage difference 412 between the top electrode 125 and the cathode when the top electrode 125 voltage is at $-V_s$ equals to $-V_s$.

Similarly in FIG. 4B, curve 403 represents the voltage between the source and chamber walls when the top electrode 125 voltage is at $+V_s$. The voltage difference 413 between the top electrode 125 and the chamber walls 128 when the top electrode voltage is at $+V_s$ equals to $V_s$. Dashed curve 404 represents the voltage between the top electrode 125 and the chamber walls 128 when the source voltage is at $-V_s$. The voltage difference 414 between the top electrode 125 and the chamber walls 128 when the top electrode voltage is at $-V_s$ equals to $-V_s$.

Figure 4C:
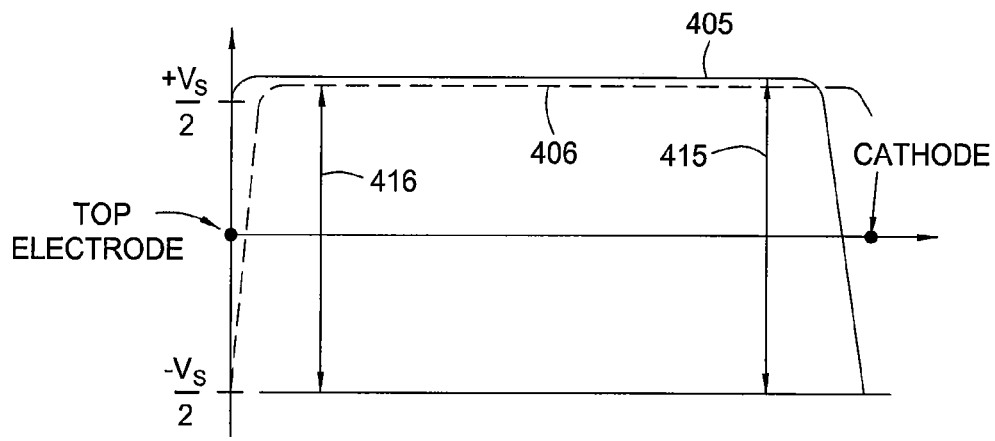
FIG. 4C shows the voltage between the top electrode and the cathode when the voltage ratio is 0.5 (or half of source voltage is supplied at top electrode).

By tuning impedance of the substrate support 105 and the impedance of the dielectric seal 130, which will be described below in more depth, the source voltage supplied to the top electrode can be reduced to a fraction of the total source voltage, such as half ($V_s/2$), while the cathode voltage is maintained at a negative phase of the top electrode to make up the difference, such as $-V_s/2$. The plasma process does not change, since the voltage difference between the source and cathode is still $V_s$ or $-V_s$. FIG. 4C shows the relative values of top electrode 125 and the cathode (not grounded). The top electrode voltage oscillates between $+V_s/2$ and $-V_s/2$, while cathode voltage oscillates between $-V_s/2$ and $V_s/2$ correspondingly. Curve 405 represents the voltage value between the electrode and cathode when the top electrode voltage is at $+V_s/2$. The voltage difference 415 between the top electrode 125 and cathode, which is formed by the substrate support 105 and the wafer 110, when the top electrode 125 voltage is at $+V_s/2$ equals to $V_s$. Dashed curve 406 represents the voltage between the top electrode 125 and the cathode when the source voltage is at $-V_s/2$. The voltage difference 416 between the top electrode 125 and the cathode when the source voltage is at $-V_s/2$ equals to $-V_s$.

Figure 4D:
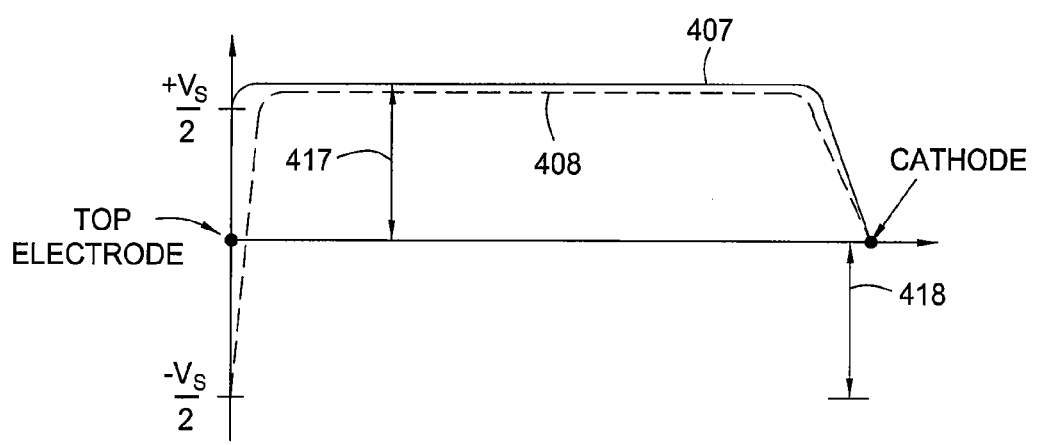
FIG. 4D shows the voltage between the top electrode and the grounded chamber wall when the voltage ratio is 0.5 (or half of source voltage is supplied at top electrode).

In FIG. 4D, curve 407 represents the voltage between the top electrode and chamber walls (grounded) when the top electrode voltage is at $+V_s/2$. The voltage difference 417 between the top electrode and chamber walls (grounded) when the top electrode voltage is at $+V_s/2$ equals to $V_s/2$. Dashed curve 408 represents the voltage between the top electrode and the chamber walls when the top electrode voltage is at $-V_s/2$. The voltage difference 418 between the top electrode and the chamber walls when the top electrode voltage is at $-V_s/2$ equals to $-V_s/2$. By tuning the impedance of the cathode to lower the voltage at the top electrode, the voltage difference between the top electrode and the chamber walls could be reduced to half of the original value. Since the voltage difference between the top electrode and the cathode is larger ($V_s$) than the voltage difference between the top electrode and the chamber walls ($V_s/2$), the plasma ions are more likely to stay in the region between the top electrode and the cathode than get pulled to the chamber walls.

In addition to lower voltage difference, the amount of power that could be lost due to un-confined plasma is also reduced to ¼. The equation 1 below shows the relationship between P (power) and voltage difference between the top electrode to the chamber walls when the top electrode voltage is $V_s$.

$$P \propto (V_s)^2 = V_s^2 \quad (1)$$

The equation 2 below shows the relationship between P (power) and voltage difference between the top electrode to the chamber walls when the top electrode voltage is only $V_s/2$.

$$P \propto (V_s/2)^2 = V_s^2/4 \quad (2)$$

By lowering the top electrode voltage to half, the power available to lose to the chamber wall is lowered to a quarter of the original value.

Lowering top electrode voltage by a voltage ratio and supplying the remaining voltage to the top electrode at a negative phase at the substrate support reduce the amount of plasma got attracted to the grounded chamber walls and thus improves plasma confinement. This method of plasma confinement is called impedance confinement. The fraction of total source voltage used in the discussion above is ½; however, other fraction values can also be used and could also improve plasma confinement. The fraction of source voltage supplied at the top electrode can also be defined as "voltage ratio". FIG. 5A is a graph of plasma density simulation result of voltage ratios of 1, 0.75, 0.5 and 0.25. The pressure at the pump entry of the simulation process is 10 mTorr and the total source power is 1.85 kW. The spacing between the annular confinement ring 115 and the inner chamber wall simulated is 1.5 inch (or 3.8 cm). Curve 501 shows that as the voltage ratio decreases from 1, the plasma density ratio is reduced. The plasma density ratio of 0.001 is lowest when the voltage ratio is at 0.5. However, plasma density ratio of 0.003 when the voltage ratio is at 0.25 and plasma density ratio of 0.008 when the voltage ratio is at 0.75 are both lower than the plasma density ratio when the voltage ratio is 1.

Figure 5B:
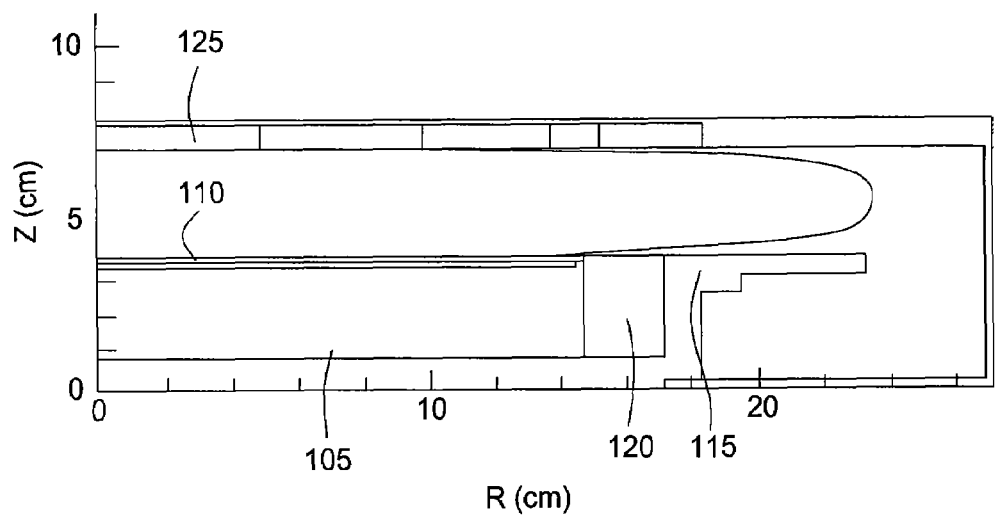
FIG. 5B shows the simulated result of plasma density in the plasma processing chamber when the gap width between the annular ring and the chamber walls is 1.5 inch and the voltage ratio is 1.
Figure 5C:
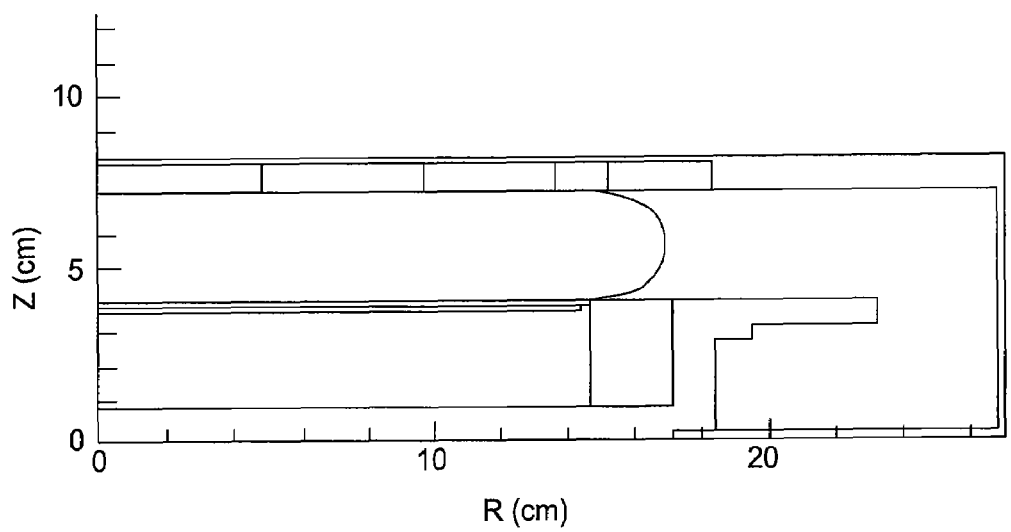
FIG. 5C shows the simulated result of plasma density in the plasma processing chamber when the gap width between the annular ring and the chamber walls is 1.5 inch and the voltage ratio is 0.5.

FIG. 5B shows the simulation result of plasma density of 0.023 in the process chamber when the voltage ratio is 1 (or source voltage is completely supplied at top electrode). The simulation results show significant amount of plasma are outside the region above the substrate. FIG. 5C shows the simulation result when the voltage ratio is reduced to 0.5. The results show that plasma is mostly confined near the region above the substrate surface. Referring back to FIG. 3B, with gap width of 1.5 in, the pressure of the chamber can be maintained at about 26.2 mTorr, which is below 30 mTorr as targeted. According to FIG. 5A, to achieve the same plasma confinement results as the slotted confinement ring, which achieves plasma density ratio of 0.004, the voltage ratio can be operated between about 0.2 to about 0.6. However, when plasma density ratio is ≦0.01, the plasma confinement is considered quite reasonable. Therefore, the voltage ratio could be operated between about 0.1 to about 0.75, according to simulation results in FIG. 5A.

The combined usage of annular plasma confinement ring and impedance confinement achieves good plasma confinement and lower chamber pressure as desired for the front end processes with a wide process window. The annular ring gap width 117 could be between about 0.8 inch to about 1.5 inch and the voltage ratio for impedance confinement could be between about 0.1 to about 0.75 and preferably between about 0.2 to about 0.6.

Figure 5D:
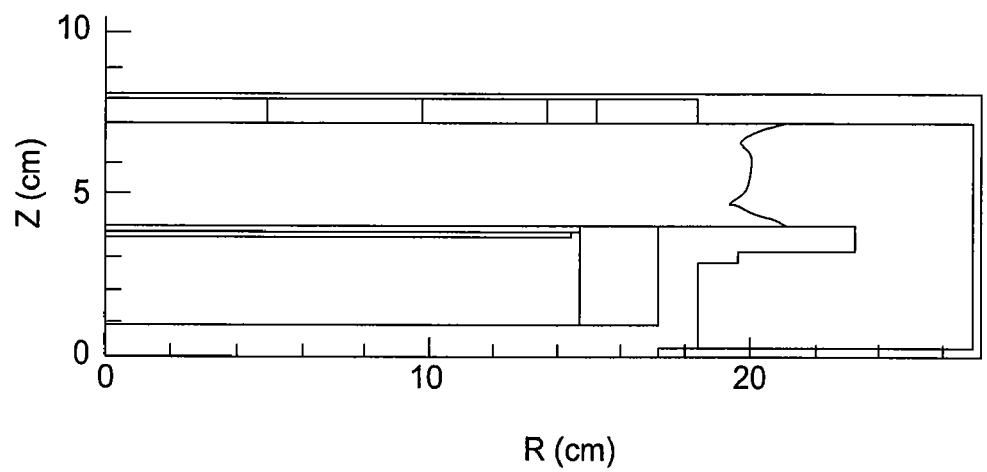
FIG. 5D shows the simulated result of power deposition in the plasma processing chamber when the gap width between the annular ring and the chamber walls is 1.5 inch and the voltage ratio is 1.
Figure 5E:
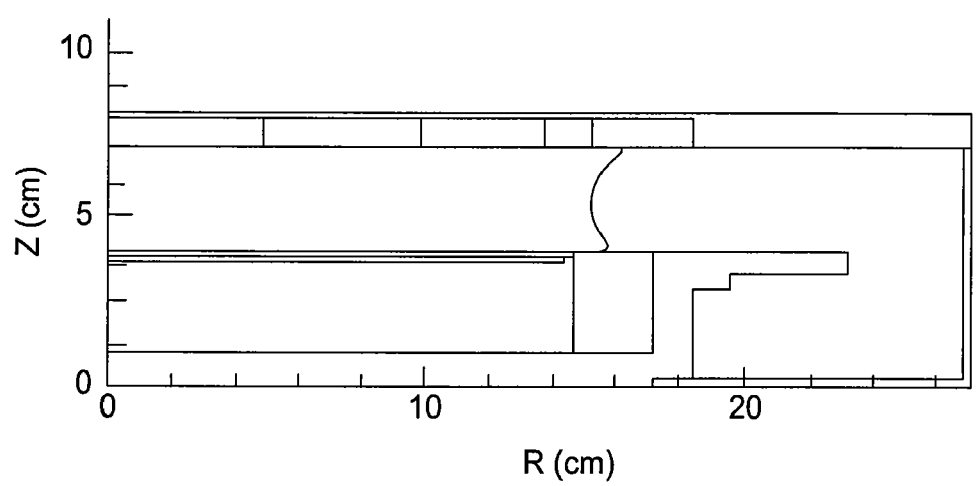
FIG. 5E shows the simulated result of power deposition in the plasma processing chamber when the gap width between the annular ring and the chamber walls is 1.5 inch and the voltage ratio is 0.5.

In addition to plasma confinement improvement, lowering the voltage ratio also reduces the power loss outside the process region. FIG. 5D shows the simulation results of power deposition, which is defined as power per volume or power density, in the process chamber when the voltage ratio is maintained at 1. The results show significant power deposition outside the process region, which is above the substrate surface or the region within 15 cm from the center of the reactor. In contrast, FIG. 5E shows the power deposition of the process chamber when the voltage ratio is 0.5. The power loss outside the process region is much reduced, compared to FIG. 5D.

Figure 6:
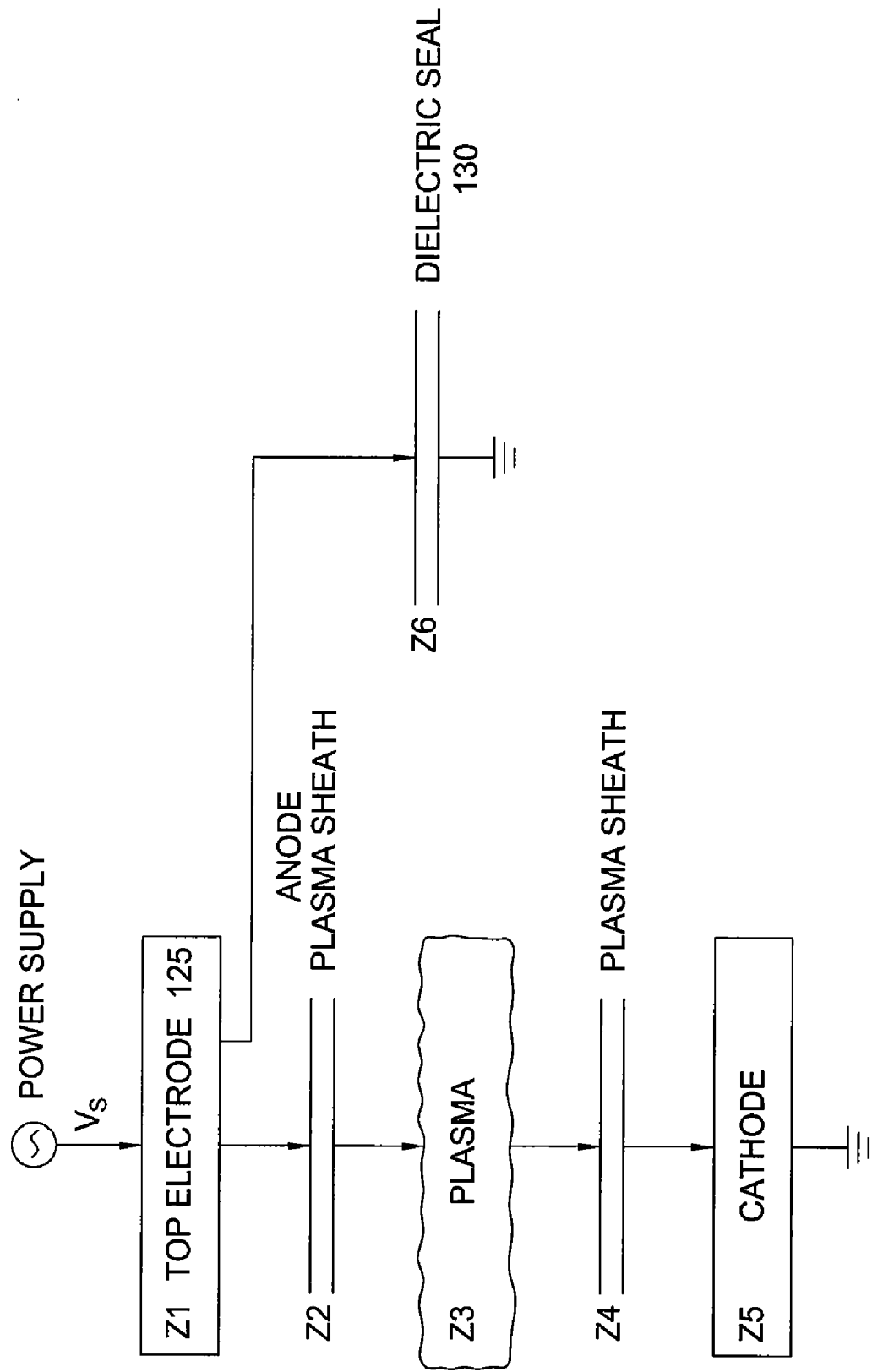
FIG. 6 shows a circuit drawing between the top electrode, the cathode and the chamber walls.

FIG. 6 is a simplified schematic diagram representing the impedance components of the reactor 100 of FIG. 1, showing the overhead electrode 125, which has an impedance $Z_1$. The electrode 125 is connected to the dielectric seal 130, which acts like a capacitor and has an impedance $Z_6$.

The cathode is formed by the substrate support 105, which has dielectric layers 5520 and 5510, and the wafer 110 during substrate processing, and the cathode has an impedance $Z_5$. If the wafer 110 is not present during processing, the substrate support 105 is the cathode. In addition to the overhead electrode 125 impedance $Z_1$ and cathode impedance $Z_5$, the bulk plasma also has impedance $Z_3$. In addition, there is an anode plasma sheath represented by an equivalent capacitor with impedance $Z_2$ in series between the electrode impedance $Z_1$ and the bulk plasma impedance $Z_3$. Furthermore, a cathode plasma sheath is represented by an equivalent capacitor with impedance $Z_4$ in series between the bulk plasma impedance $Z_3$ and the cathode impedance $Z_5$.

Equation 1 shows the relationship between impedance (Z), resistance (R) and capacitance reactance ($X_c$). "j" in equation 1 is an imaginary number.

$$Z = R - jX_c \quad (1)$$

Equation 2 shows the relationship between the capacitance reactance ($X_c$) and capacitance C.

$$X_c = 1/(2\pi f C) \quad (2)$$

where f is the frequency of the source power and C is the capacitance.

FIG. 6 shows that the top electrode 125, anode plasma sheath, plasma, cathode plasma sheath, and cathode are in serial and these impedance components are in parallel with the dielectric seal 130. Equation 3 shows the total impedance, $Z_{total}$.

$$Z_{total} = Z_1 + 1/(1/(Z_2 + Z_3 + Z_4 + Z_5) + 1/Z_6) \quad (3)$$

Since the top electrode is typically made of conductive material, its impedance $Z_1$ is mainly made of the resistance of the top electrode. $Z_2$, $Z_3$ and $Z_4$ are affected by the plasma. However, impedance Z5 and Z6 can be adjusted by changing the thicknesses and dielectric constants of the dielectric layers of the substrate support 105, and the dielectric seal 130. The magnitude of the cathode impedance can be affected the cathode capacitance. Z5 and Z6 can be adjusted to allow supplying the top electrode 125 at a fraction of conventional source voltage, $fV_s$, and maintaining the cathode at a voltage of negative phase from the top electrode, $-(1-f)V_s$.

While the foregoing is directed to embodiments of the invention, other and further embodiments of the invention may be devised without departing from the basic scope thereof, and the scope thereof is determined by the claims that follow.

What is claimed is:

1. A plasma reactor, comprising:
   a vacuum chamber body;
   a substrate support disposed in the vacuum chamber body;
   an RF electrode disposed above the substrate support;
   a very high frequency power generator coupled to the RF electrode by a coaxial stub;
   a bias power generator coupled to the substrate support; and
   an annular ring disposed on the substrate support, the ring comprising:
      an upper outer wall defining an outermost diameter of the ring;
      a lower outer wall;
      an intermediate outer wall formed between the upper outer wall and the lower outer wall;
      a step defined by the intermediate outer wall between the upper and lower outer wall;
      a substantially vertical inner wall disposed opposite the upper and lower outer wall;
      a bottom wall connecting the lower outer wall and the substantially vertical inner wall; and
      a substantially horizontal to surface connecting the upper outer wall and the substantially vertical inner wall.

2. The plasma reactor of claim 1, wherein the step is formed upward and outward from the lower outer wall and inward and downward from the upper outer wall.

3. The plasma reactor of claim 1, wherein the annular ring is fabricated from a conductive material.

4. The plasma reactor of claim 1, wherein the annular ring comprises silicon carbide (SIC) or aluminum (Al).

5. The plasma reactor of claim 1, wherein the lower outer wall has a diameter less than a diameter of the upper outer wall.

6. The plasma reactor of claim 1, wherein the upper outer wall and the inner wall of the annular ring define a top section in the annular ring.

7. The plasma reactor of claim 1, wherein the inner wall of the annular ring is dimensioned to circumscribe a ring and substrate disposed on a substrate support.

8. The plasma reactor of claim 1, wherein the substrate support further comprises:

an RF conductor disposed on the substrate support and coupled to the bias power source; and a dielectric cylindrical sleeve circumscribing the RF conductor, the sleeve having a length and material selected to a uniform radial distribution of impedance of the substrate support.

9. The plasma reactor of claim 1, wherein the upper outer wall has a diameter between about 15.5 and about 20.5 inches.

10. The plasma reactor of claim 1, wherein the annular ring is oriented to direct gas flow from a substrate processing region of the processing chamber through a gap between the annular ring and process chamber walls with a gap width from about 0.8 inch to about 1.5 inch into a lower region of the processing chamber.

11. The plasma reactor of claim 1, further comprising:
a dielectric seal around the RF electrode, wherein impedances of the dielectric seal and the substrate support lower a voltage supplied to the RF electrode to a predetermined fraction of a source voltage, and supply the remaining voltage at a negative phase at the substrate support during plasma processing.

12. A plasma reactor, comprising:
a vacuum chamber body;
a substrate support disposed in the vacuum chamber body;
an RF electrode disposed above the substrate support;
a very high frequency power generator coupled to the RF electrode;
a bias power generator coupled to the substrate support; and
a conductive annular ring disposed on the substrate support the ring comprising:
an upper outer wall defining an outermost diameter of the ring;
a lower outer wall;
an intermediate outer wall formed between the upper outer wall and the lower outer wall;
a step defined by the intermediate outer wall extending upward and outward from the lower outer wall, the step disposed inward and downward from the upper outer wall; and
a substantially vertical inner wall disposed opposite the upper and lower outer wall;
a bottom wall connecting the lower outer wall and the substantially vertical inner wall; and
a substantially horizontal top surface connecting the upper outer wall and the substantially vertical inner wall.

13. The plasma reactor of claim 12, wherein the annular ring comprises silicon carbide (SIC) or aluminum (Al).

14. The plasma reactor of claim 12, wherein the inner wall of the annular ring is dimensioned to circumscribe a second ring and substrate disposed on a substrate support.

15. The plasma reactor of claim 12, wherein the inner wall has a diameter between about 12.5 and about 15 inches.

16. The plasma reactor of claim 12, wherein the upper outer wall has a diameter between about 15.5 and about 20.5 inches.

17. The plasma reactor of claim 12, wherein the substrate support further comprises:
an RF conductor disposed on the substrate support and coupled to the bias bale power source; and
a dielectric cylindrical sleeve circumscribing the RF conductor, the sleeve having a length and material selected to a uniform radial distribution of impedance of the substrate support.

18. A plasma reactor, comprising:
a vacuum chamber body;
a substrate support disposed in the vacuum chamber body;
an RF electrode disposed above the substrate support;
a very high frequency power generator coupled to the RF electrode by a coaxial stub;
a bias power generator coupled to the substrate support; and a conductive annular ring comprising:
an upper outer wall having a diameter between about 15.5 and about 20.5 inches defining an outermost diameter of the ring;
a lower outer wall;
an intermediate outer wall formed between the upper outer wall and the lower outer wall;
a step defined by the intermediate outer wall formed upward and outward from the lower outer wall and inward and downward from the upper outer wall;
a substantially vertical inner wall disposed opposite the upper and lower outer wall, the inner wall having a diameter between about 12.5 and about 15 inches;
a bottom wall connecting the lower outer wall and the substantially vertical inner wall; and
a substantially horizontal ton surface connecting the upper outer wall and the substantially vertical inner wall.

19. The plasma reactor of claim 18, wherein the annular ring comprises at least one of silicon carbide (SiC) or aluminum (Al).

20. The plasma reactor of claim 18, wherein the substrate support further comprises:
an RF conductor disposed on the substrate support and coupled to the bias power source; and
a dielectric cylindrical sleeve circumscribing the RF conductor, the sleeve having a length and material selected to a uniform radial distribution of impedance of the substrate support.

* * * * *

UNITED STATES PATENT AND TRADEMARK OFFICE
CERTIFICATE OF CORRECTION

PATENT NO. : 7,674,353 B2  Page 1 of 1
APPLICATION NO. : 11/531479
DATED : March 9, 2010
INVENTOR(S) : Bera et al.

It is certified that error appears in the above-identified patent and that said Letters Patent is hereby corrected as shown below:

In the Claims:

Column 14, Claim 1, Line 46, please delete "to" and insert --top-- therefor;

Column 14, Claim 4, Line 56, please delete "(SIC)" and insert --(SiC)-- therefor;

Column 15, Claim 12, Line 41, please delete "and";

Column 15, Claim 13, Line 50, please delete "(SIC)" and insert --(SiC)-- therefor;

Column 16, Claim 17, Line 9, please delete "bale";

Column 16, Claim 18, Line 37, please delete "ton" and insert --top-- therefor.

Signed and Sealed this

Eighth Day of June, 2010

David J. Kappos
*Director of the United States Patent and Trademark Office*